(12) United States Patent
Gao

(10) Patent No.: US 11,729,953 B2
(45) Date of Patent: Aug. 15, 2023

(54) PRESSURE BASED REGULATING DESIGN IN FLUID CONDITIONING AND DISTRIBUTION SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/144,013

(22) Filed: Jan. 7, 2021

(65) Prior Publication Data
US 2022/0217873 A1 Jul. 7, 2022

(51) Int. Cl.
*H05K 7/20* (2006.01)
*G05D 16/08* (2006.01)
*G06F 1/20* (2006.01)

(52) U.S. Cl.
CPC ..... *H05K 7/20781* (2013.01); *H05K 7/20272* (2013.01); *G05D 16/08* (2013.01); *G06F 1/206* (2013.01)

(58) Field of Classification Search
None
See application file for complete search history.

(56) References Cited

U.S. PATENT DOCUMENTS 6,360,559 B1   3/2002   Midorikawa
8,018,718 B2 *  9/2011  Goth ............... F25B 49/02
                                             361/699
8,514,575 B2 *  8/2013  Goth ............... H05K 7/20781
                                             361/698
8,567,486 B1 * 10/2013  Wolf, Sr. ......... F28D 15/043
                                             165/274

(Continued)

FOREIGN PATENT DOCUMENTS

JP      05141831 A    6/1993
JP      2001050624 A  2/2001

(Continued)

*Primary Examiner* — Courtney L Smith
(74) *Attorney, Agent, or Firm* — Womble Bond Dickinson (US) LLP

(57) ABSTRACT

A cooling system includes an inlet port and an outlet port to be coupled to one or more electronic devices, a main loop having a heat exchanger coupled to the inlet port and the outlet port, and a buffer loop coupled to the inlet port and the outlet port. The main loop having a heat exchanger to receive fluid from the inlet port, to extract heat generated by the electronic devices and carried by the fluid, and to return the fluid to the electronic devices via the outlet. In an embodiment, a cooling system includes a buffer loop, configured in parallel with the main loop, with a buffer unit to temporarily buffer at least a portion of the fluid, and a first pressure controllable valve, coupled to the main loop and the buffer loop, to selectively distribute at least a portion of the fluid to at least one of the main loop or the buffer loop based on a fluid pressure of the fluid. In an embodiment, a cooling system includes a bypass loop coupled between the first pressure controllable valve and the outlet port to operate as a direct bypass loop from the inlet port to the outlet port, bypassing the heat exchanger and the buffer unit. Pressure is measured and used for controlling those loops under different working scenarios.

20 Claims, 11 Drawing Sheets

(56) References Cited

U.S. PATENT DOCUMENTS

| | | | |
|---|---|---|---|
| 9,958,191 B2* | 5/2018 | Kawano | F25B 9/002 |
| 10,184,699 B2* | 1/2019 | Shedd | F28F 13/02 |
| 2008/0013278 A1 | 1/2008 | Landry et al. | |
| 2008/0141703 A1 | 6/2008 | Bean | |
| 2010/0170663 A1* | 7/2010 | Bean, Jr. | H05K 7/20763 |
| | | | 165/104.33 |
| 2011/0051372 A1 | 3/2011 | Barringer et al. | |
| 2015/0316334 A1* | 11/2015 | Chainer | G05D 23/1932 |
| | | | 165/287 |
| 2018/0084671 A1 | 3/2018 | Matsumoto et al. | |
| 2020/0288600 A1 | 9/2020 | Gao | |
| 2022/0034561 A1* | 2/2022 | Suwa | F25B 49/02 |
| 2022/0090868 A1* | 3/2022 | Donovan | F24F 11/30 |

FOREIGN PATENT DOCUMENTS

| | | | |
|---|---|---|---|
| JP | 2010513845 A | 4/2010 | |
| JP | 2010514145 A | 4/2010 | |
| WO | 2018051501 A1 | 3/2018 | |

* cited by examiner

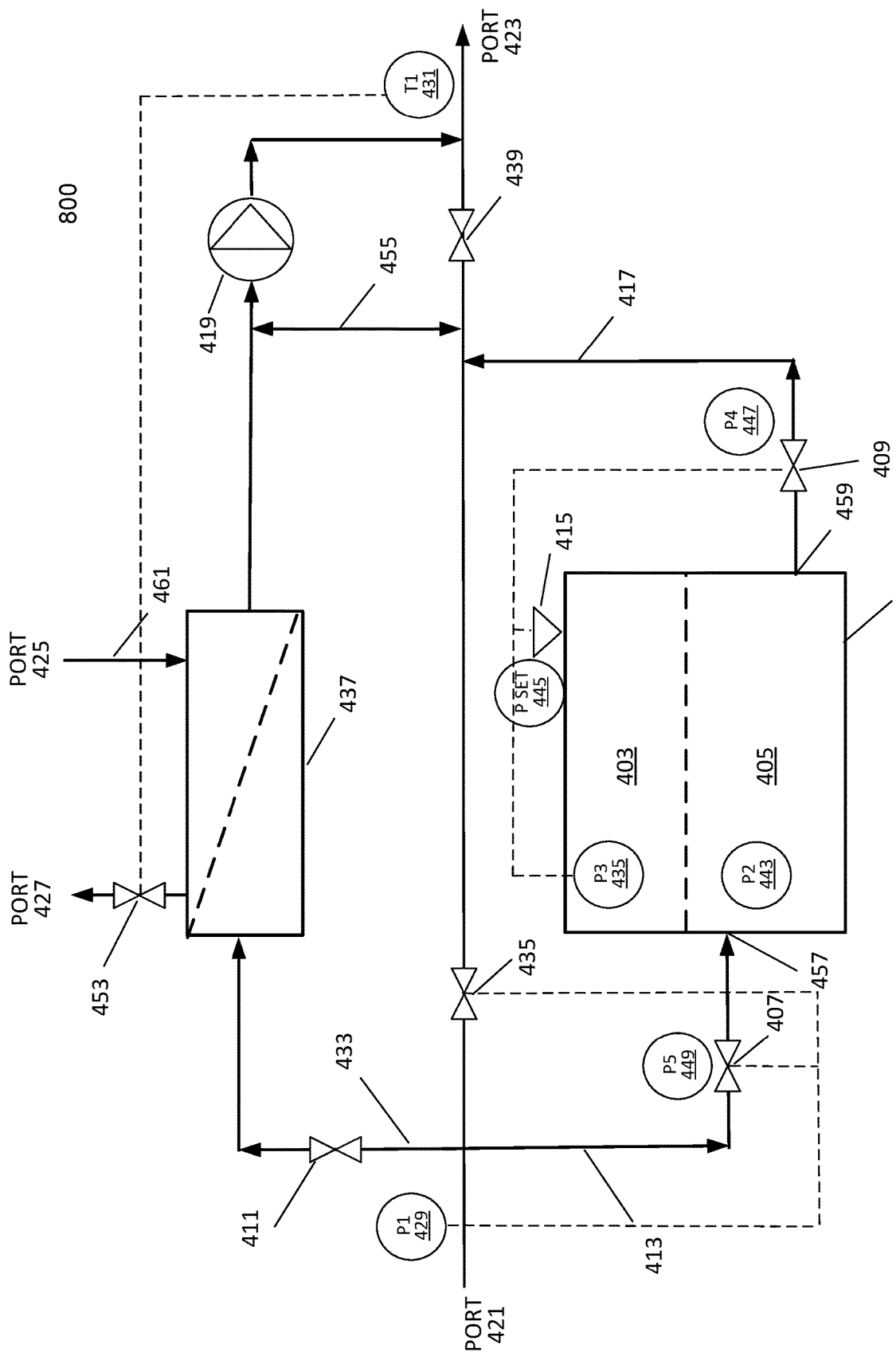

PRESSURE BASED REGULATING DESIGN IN FLUID CONDITIONING AND DISTRIBUTION SYSTEM

FIELD OF THE INVENTION

Embodiments of the present invention relate generally to data center cooling. More particularly, embodiments of the invention relate to a buffer unit design for cooling of electronics devices such as data center, IT system design, and system control.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

BRIEF DESCRIPTION OF THE DRAWINGS

Embodiments of the invention are illustrated by way of example and not limitation in the figures of the accompanying drawings in which like references indicate similar elements.

FIG. 8A shows another example cooling system according to an embodiment of the application.

DETAILED DESCRIPTION

Figure 1:
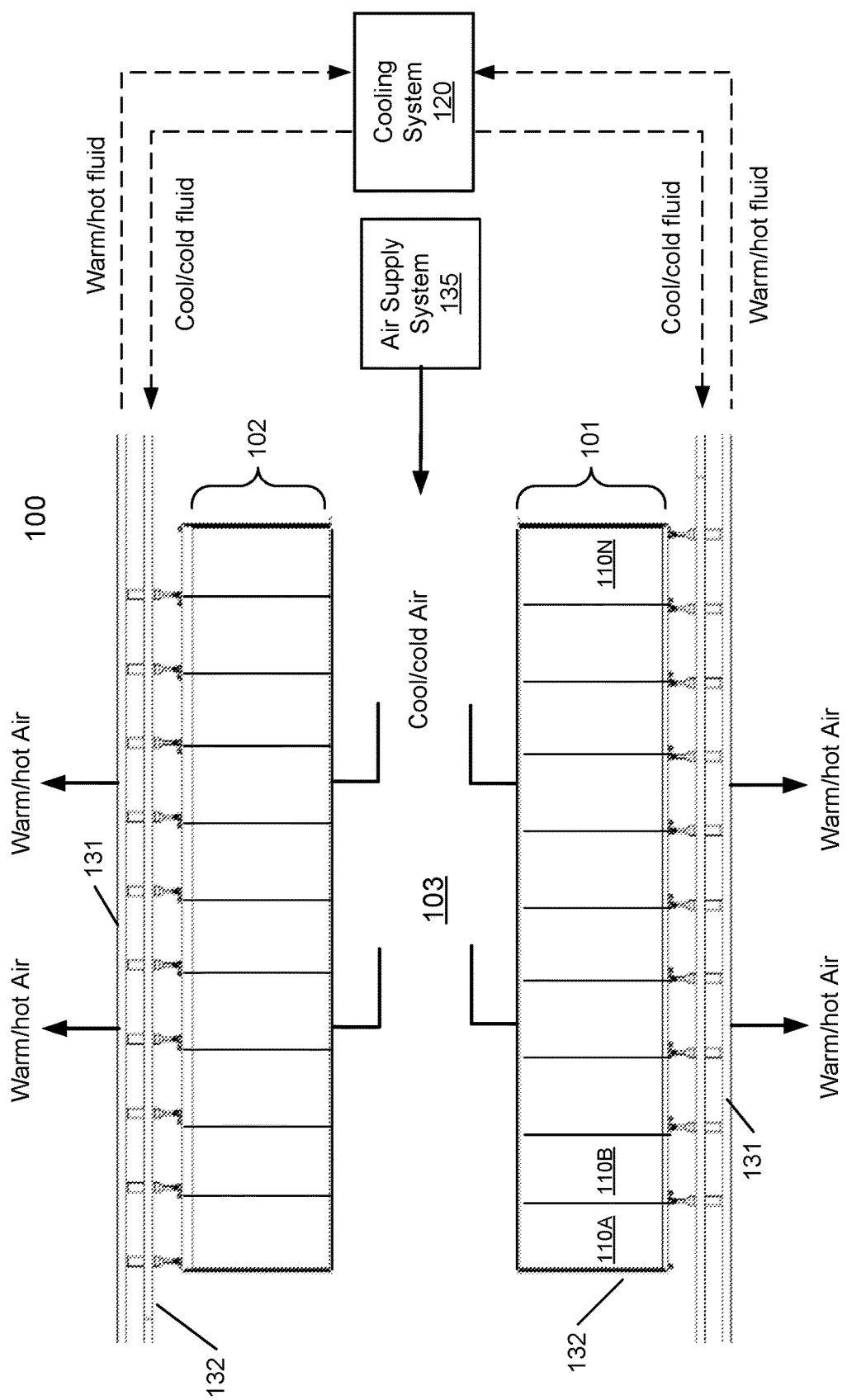
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Cooling is critical to IT Hardware industry due to many reasons, besides ensuring normal operation and function. For example, not only does it play a crucial role in the hardware's infrastructure capability, service quality and availability, but it's also significantly cheaper. This directly impacts the profit of a service provider. This industry is one of the core competitors of the internet, cloud computing, high performance computing, AI based businesses, and any related other businesses that use computational, storage and internet hardware platforms, or infrastructures. For instance, for the rapidly growing cloud computing business, the performance and cost (both capital cost and operation cost) of compute and storage hardware systems, clusters, and infrastructures directly impact the success of a business. All these markets require continuous innovation and creation. Furthermore, a robust system architecture, or control and operation strategy may also benefit service providers in multiple aspects long term.

The goal is to provide increasingly advanced services by innovating and developing compute and storage infrastructures, and platforms with high resilience and flexible configurations to accommodate the dynamic variations in software, application, and business setting while simultaneously decreasing TCO. The system architecture design and control both play significant roles in this process.

The current disclosure introduces a system design and operation method for fluid conditioning and distribution using pressure. The design aims to enable a higher performance and better controlled fluid environment for an IT system thermal management and fluid management. In addition, this solution can be cross applied to handle multiple variations and dynamics in a liquid based cooling loop.

One of the challenges in the system design is to handle different types of normal and abnormal variations in a fluid based heat transfer system. This may include the variations in the heat load and cooling capacity as well as system failure, and other services. The system design, as well as the corresponding operation and control, should be robust and simple to accommodate these changes and anomalies.

Reliability presents another challenge. The current disclosure introduces a buffer loop together with its control feature enabled to provide reliable maintenance capabilities, minimizing the impact on the fluid, including the fluid pressure and temperature. Since the reliability become increasingly critical for modern IT cluster and hardware equipment, corresponding cooling fluid must be better controlled and regulated.

The system needs to be in high resilience, meaning it should be adjustable for different cooling loop arrangements and configurations in different use cases. Not only does this require a high resilience in hardware and system design, but this also requires advanced control and operation strategy to enable a full system functioning synergistically.

Self-regulating control is an important feature for modern clusters and systems. While a robust control design should be less dependent on sensors and complex software/algorithm, it must also provide designed operation conditions such as fluid conditions and distribution within the system and for the load. Thus, self-regulating features for components and system loops are one of the key technical directions in this field.

The pressure control for the system proposed is a novel design. The previous solution may require multiple control signals for the entire system, and the previous solution may not consider the system and operation proposed in the current disclosure. The bypass loop design with either a buffer unit or/and an expansion system combined with different types of valves and advanced control for the individual components all contribute to the innovation feature in multiple scenarios.

A pressure based system design and operation is proposed in the current disclosure. The system includes a heat exchanger unit to exchange heat between the first fluid and the second fluid. The system design enables it to pump, distribute, condition, and regulate the first fluid based on the needs and variations in the system. Different types of system design are proposed with different components and loops in configuring the buffering loop, including using 4-way valve, pressure triggered valve as well as different types of buffering loops and systems. In addition, the system operation and control for each individual component and the system design are introduced and provided. Fluid pressure is measured and used as the key metrics, by either controlling the hydraulic parts directly or indirectly through the controller, for proper fluid conditioning and distribution with the variations in the fluid pressure. The approach enables a self-regulating system for fluid and thermal management.

In an embodiment, a cooling system includes an inlet port and an outlet port to be coupled to one or more electronic devices, a main loop having a heat exchanger coupled to the inlet port and the outlet port, and a buffer loop coupled to the inlet port and the outlet port.

For example, the main loop having a heat exchanger to receive fluid from the inlet port, to extract the heat which is generated by the electronic devices and carried by the fluid, and to return the fluid to the electronic devices via the outlet.

In an embodiment, a cooling system includes a buffer loop, configured in parallel with the main loop, with a buffer unit to temporarily buffer at least a portion of the fluid, and a first pressure controllable valve, coupled to the main loop and the buffer loop, to selectively distribute at least a portion of the fluid to at least one of the main loop or the buffer loop based on a fluid pressure of the fluid.

In an embodiment, a cooling system includes a bypass loop coupled between the first pressure controllable valve and the outlet port to operate as a direct bypass loop from the inlet port to the outlet port, bypassing the heat exchanger and the buffer unit.

In an embodiment, the first pressure controllable valve in the cooling system is a four-way valve to selective to distribute the fluid received from the inlet port to at least one of the first loop, the second loop, or the third loop.

In an embodiment, the first pressure controllable valve in the cooling system includes a first valve coupled between the inlet port and an inlet of the heat exchanger to control fluid flowrate of a first fluid flowing into the heat exchanger based on the fluid pressure, a second valve coupled between the inlet port and an inlet of the buffer unit to control fluid flowrate of a second fluid flowing into the buffer unit, and a third valve coupled between the inlet port and the direct bypass loop to control fluid flowrate of a third fluid flowing through the direct bypass loop based on the fluid pressure In an embodiment, the first valve in the cooling system is triggered to open in response to the fluid pressure being above a first pressure threshold. In an embodiment, the second valve is triggered to open in response to the fluid pressure being above a second pressure threshold. In an embodiment, the third valve is triggered to open in response to the fluid pressure being above a third pressure threshold. In an embodiment, the first pressure threshold, the second pressure threshold, and the third pressure threshold are different.

In an embodiment, the buffer loop further includes a second pressure controllable valve disposed between an outlet of the buffer unit and the outlet port to control a flowrate of fluid from the outlet of the buffer unit to the outlet port. For example, the second pressure controllable valve is controlled based on a fluid pressure obtained from a pressure sensor within the buffer unit or a fluid pressure obtained from a pressure sensor disposed near the inlet port.

In an embodiment, the bypass loop further includes a fourth valve coupled between the third valve and the outlet port. For example, the second pressure controllable valve is coupled between the buffer unit and a connecting point between the third valve and the fourth valve.

In an embodiment, a cooling system includes a fluid pump couple between an outlet of the heat exchanger and the outlet port to pump the fluid towards the outlet port.

In an embodiment, a cooling system includes a bidirectional path coupled between the connecting point and an inlet of the fluid pump.

In an embodiment, a cooling system includes an external loop coupled with the heat exchanger, a fifth pressure controllable valve and an external outlet port. For example, the heat exchanger is to receive external fluid from the external inlet port and to return the external fluid via the external outlet port.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and back ends facing away from each other, forming aisle 103 in between to allow an administrative person walking therein. However, other configurations or arrangements may also be applied. For example, two rows of electronic racks may back to back face each other without forming an aisle in between, while their frontends face away from each other. The back ends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard drive HD, solid state drive SSD), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their back ends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
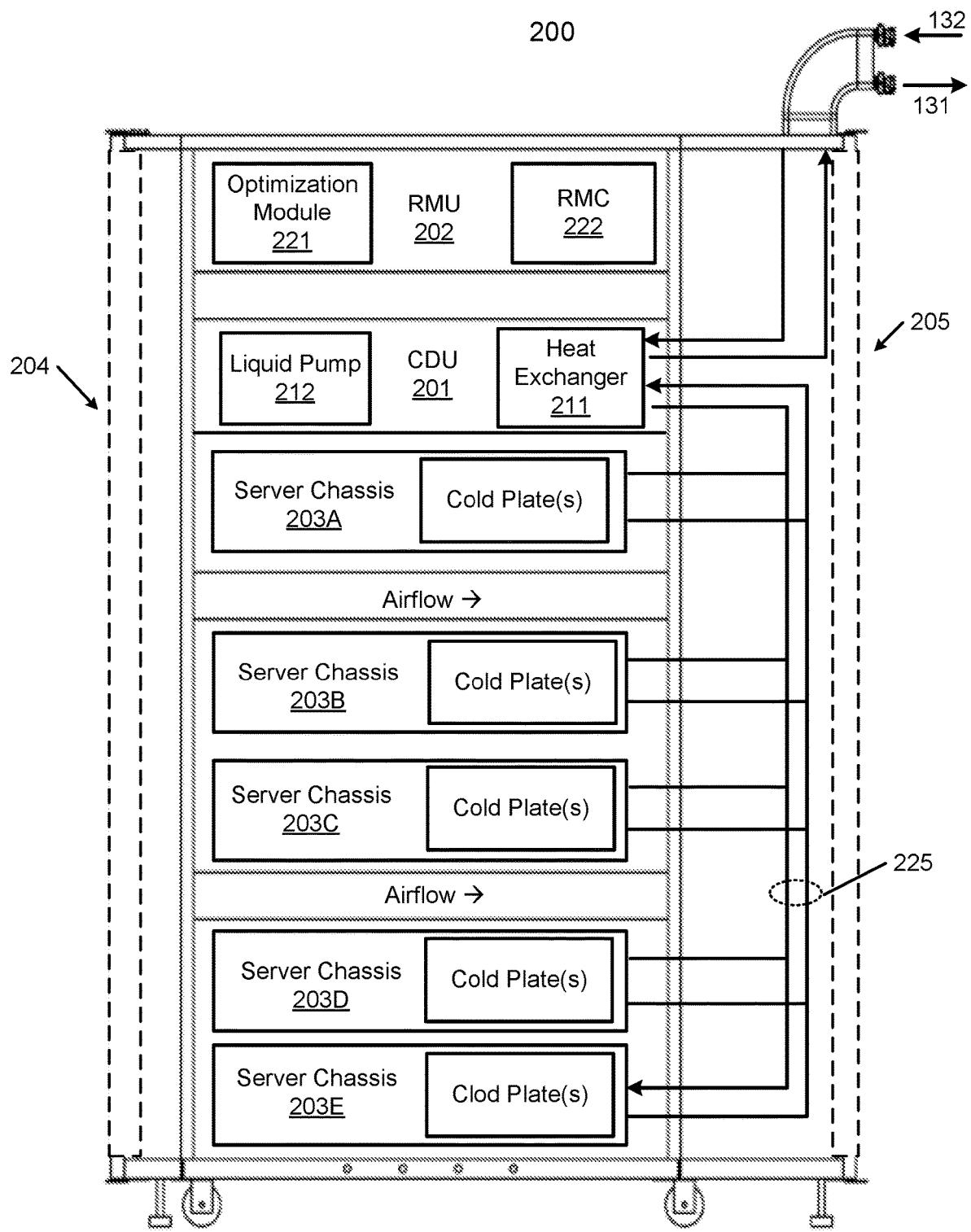
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the back ends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules 231, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
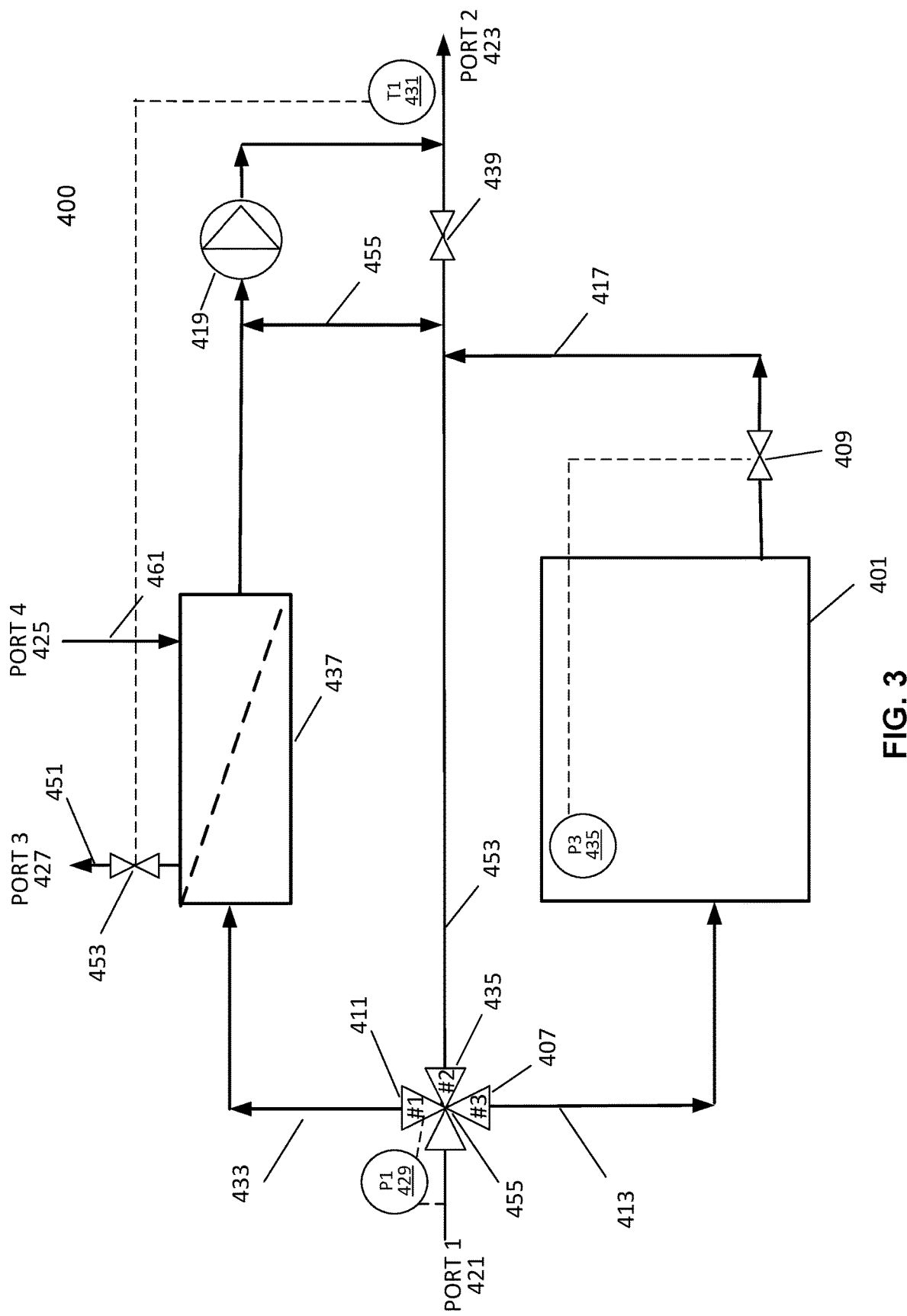
FIG. 3 shows an example cooling system according to an embodiment of the application.

FIG. 3 shows an example cooling system 400 according to an embodiment of the application. The cooling system may be implemented as part of cooling system 120 of FIG. 1 or as part of CDU 201 of FIG. 2. For example, FIG. 3 shows a schematic representation of the fluid conditioning and distribution system. In an embodiment, the cooling system includes two fluid streams (433, 451) exchanging thermal energy. For example, the main fluid 433 inlet and outlet are port #1 (421) and port #2 (423), and the external/heat exchanger fluid 451 inlet and outlet are port #3 (427) and port #4 (425). Inlet port 421 may be coupled to a cold plate attached to an electronic device that generates heat to receive the fluid carrying the heat. Outlet port 423 may supply the fluid back to the cold plate of the electronic device or to a cold plate of another electronic device. An electronic device may be a processor or other IT component within an electronic rack as described above. In an embodiment, the heat is exchanged between the two fluids (433, 451) through the heat exchanger (HX) unit 437. In an embodiment, the main function of the system is used for regulating and controlling of the pressure, temperature and flowrate of the main fluid 433 by adjusting the entire system and components.

In FIG. 3, in an embodiment, the valve 453 is used for regulating the flowrate of the second/external fluid 451 of the external loop of the heat exchanger 437, and this valve 453 in FIG. 3 system is controlled by the temperature sensor 431. In an embodiment, the pump 419 is used for pulling or pushing the fluid through the system. In an embodiment, the two-way loop 455 enables the main fluid 433 moving in either direction.

In an embodiment, the key design in the system is the design of the bypass loop 453 and this is the core focus in this disclosure. In an embodiment, key components of the bypass loop 453 are a buffer unit 401 and its corresponding loop 413. For example, the buffer unit 401 buffers the variations in pressure and fluid volume happened due to multiple reasons. In an embodiment, another loop is a direct bypass loop 453 without any components used on the system according to an embodiment. In an embodiment, the main focus of the current disclosure is on the buffer unit loop 413.

In an embodiment, a pressure sensor P1 429 is used at the inlet close to the port #1 421. In an embodiment, a four-way valve 455 is used for manipulating and regulating fluid to the main loop 433, the direct bypass loop 453, and/or the buffer loop 413. Valve 455 is configured to distribute same or different amount of fluid to loops 433, 453, and/or 413, dependent upon the fluid pressure sensed by pressure sensor 429. The valve opening ratio of each way may be different, which may be opened, closed, or anywhere in between based on a specific pressure threshold. The detailed operation of using the four-way valve 455 in the system shown in FIG. 3 are described in the next section FIG. 4. In addition, in an embodiment, the valve 409 is used on the buffer loop (413, 417) controlling the fluid on this loop. In an embodiment, valve 409 can be either controlled by a fluid pressure sensor 435 within the buffer unit 401 or/and the same pressure sensor P1 429.

In an embodiment, a cooling system 400 includes an external output loop 451 coupled with the heat exchanger 437, a fifth pressure controllable valve 453 and an external outlet port 427. For example, the heat exchanger 437 is to receive external fluid from the external inlet port 425 via an external input loop 461 and to return the external fluid via external output loop 451 to the external outlet port 427.

Overall, the buffer unit/loop 413, the direct loop 453 as well as the main/heat exchanger loop 433 are regulated by the four-way valve 455 to achieve the fluid distribution and conditioning. In an embodiment, the bypass loop 453 is extended and is parallel with the pump 419 in the system.

Figure 4:
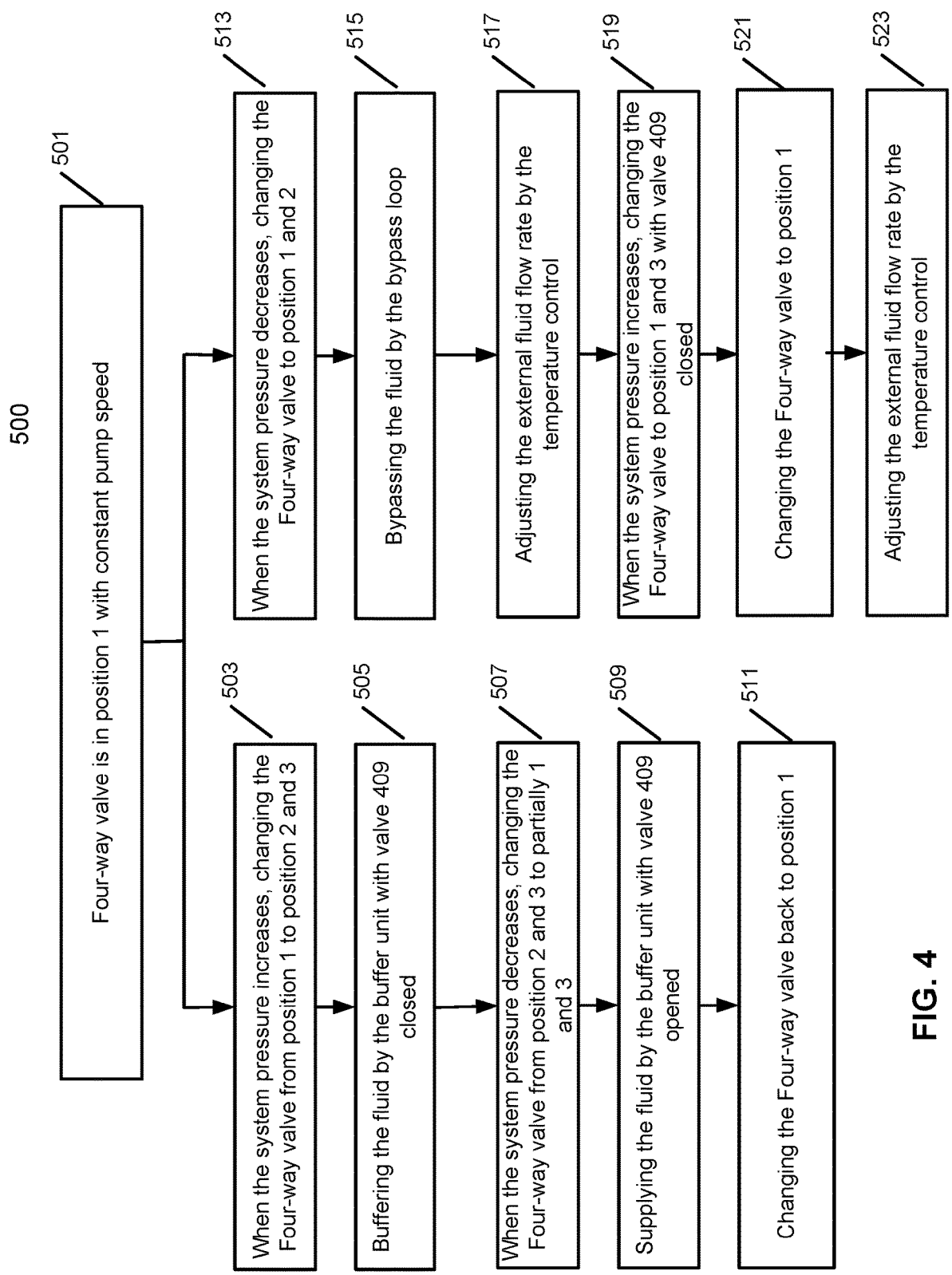
FIG. 4 is a flow diagram of an example process for a cooling system according to an embodiment of the application.

FIG. 4 is a flow diagram of an example process 500 for a cooling system according to an embodiment of the application. For example, FIG. 4 shows the system operation for the one shown in FIG. 3. In an embodiment, the example process 500 includes two scenarios, which are the system pressure increasing or decreasing. For example, the key feature is controlling and switching the four-way valve 455 to manage main fluid conditions in the cooling system when the pressure varies caused by either during normal operations or abnormal operations, as well as to accommodate the unbalances between the cooling capacity and heating load.

At operation 501, the four-way valve 455 is in position #1 411 with constant pump speed. In an embodiment, when the main/heat changer loop 433 disconnected or other scenarios, the system pressure P1 421 will increase to cause a higher flowrate from Port #1 411. In an embodiment, at operation 503, in response to the system pressure P1 429 increases, the four-way valve 455 changes the position #1 411 to position #2 435 and position #3 407. At operation 505, with remaining similar flowrate of Port #2 423, the buffer unit 401 buffers the fluid with the valve 409 closed.

In an embodiment, when the main/heat changer loop 433 is plugged in or other scenarios, the system pressure P1 421 will decrease to cause a lower flowrate from Port #1 411. In an embodiment, at operation 507, in response to the system pressure P1 429 decreases, the four-way valve 455 changes the position from position #2 435 and #3 407 to partially #1 411 and #3 407. At operation 509, with remaining similar flowrate of Port #2 423, the buffer unit 401 supplies the fluid with the valve 409 opened. At operation 511, the four-way valve changes back to position #1 411.

In an embodiment, when the pump 419 is disconnected or other scenarios, the system pressure P1 421 will decrease to cause a lower flowrate from Port #1 411. In an embodiment, at operation 513, in response to the system pressure P1 429 decreases, the four-way valve 455 changes the position to position #1 411 and #2 435. At operation 515, with remaining similar flowrate of Port #2 423, the bypass loop 453 bypasses the fluid. At operation 517, the four-way valve changes back to position #1 411.

In an embodiment, when the pump 419 is plugged in or other scenarios, the system pressure P1 421 will increase to cause a higher flowrate from Port #1 411. In an embodiment, at operation 519, in response to the system pressure P1 429 increases, the four-way valve 455 changes to the position #1 411 and #3 407 with the valve 409 closed. At operation 521, with remaining similar flowrate of Port #2 423, the four-way valve 455 changes to the position #1 411 with the valve 409 opened. At operation 523, the temperature control 431 can adjust the external fluid flowrate.

Figure 5:
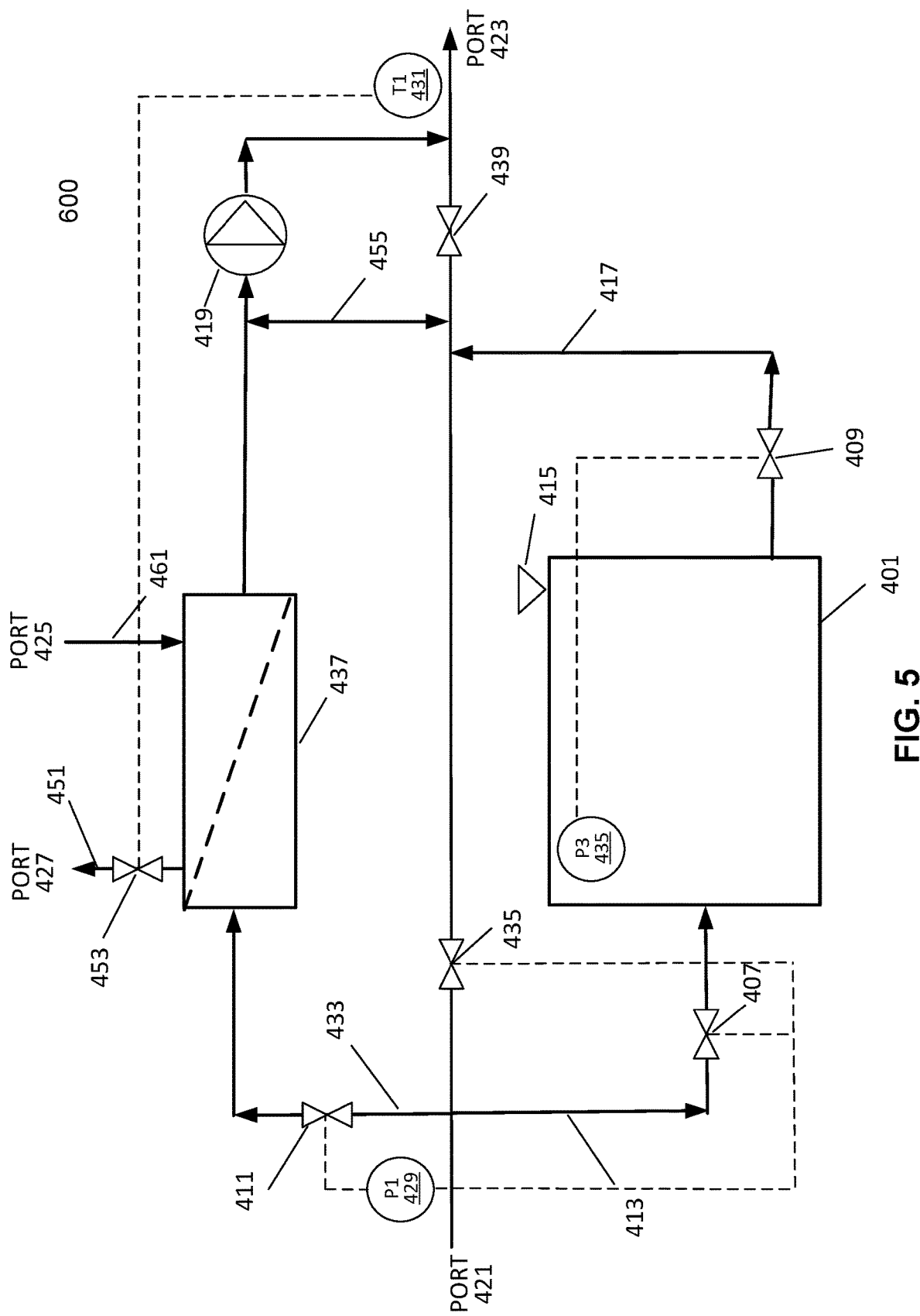
FIG. 5 shows another example cooling system according to an embodiment of the application.

FIG. 5 shows another example cooling system 600 according to an embodiment of the application. For example, FIG. 5 shows another bypass loop design for the system. The main functions of the system shown in FIG. 5 are almost the same as the one shown in FIG. 3. The main difference is that instead of using a four-way valve 455 for regulating different loops, individual two-way valve is used. Each of valves 411, 435, and 407 may be associated with the same or different thresholds to open or close the corresponding valve, fully or partially.

In an embodiment, valve 435 and valve 407 as well as valve 409 are pressure controlled and pressure trigger valve, which means that those valves can be opened by the fluid pressure once the fluid pressure is larger than these valves opening pressure. In an embodiment, the opening pressure can be also controlled by the pressure signal received by the valves. For example, valve 453 can be a regular valve for controlling the fluid within the heat exchanger loop 451. In an embodiment, valve 409 is used for regulating the second fluid into the external loop 417. In an embodiment, the valve 411 can also be controlled by the pressure P1 429.

In an embodiment, for the valve 435 and valve 407, they will be opened, fully or partially, by the fluid pressure 429 once the pressure as P1 429 increases to a predetermined threshold. In an embodiment, the opening pressure P1 429 for valve 435 and valve 407 may be different. For example, during normal operation, fluid only passes through the main/heat exchanger loop 433 since valve 435 and valve 407 are closed. In an embodiment, when the pressure P1 429 increases, then the valve 435 and valve 407 can be triggered and status can be changed from close to open. Then, for example, the fluid can be distributed through the corresponding loop.

In addition, as mentioned above, in an embodiment, the corresponding opening pressure can be adjusted and tuned based on the system requirement. In an embodiment, the valve 409 can be controlled by the fluid pressure within the buffer unit 401 or/and the same pressure as valve 407. In an embodiment, in the buffering mode, valve 407 is opened and valve 409 is closed. In an embodiment, in the releasing mode, valve 407 is closed and valve 409 is opened. In an embodiment, air pressure adjustment valve 415 is used for adjusting the pressure of the buffering section in the buffer unit system, for example, for discharging scenarios.

Figure 6:
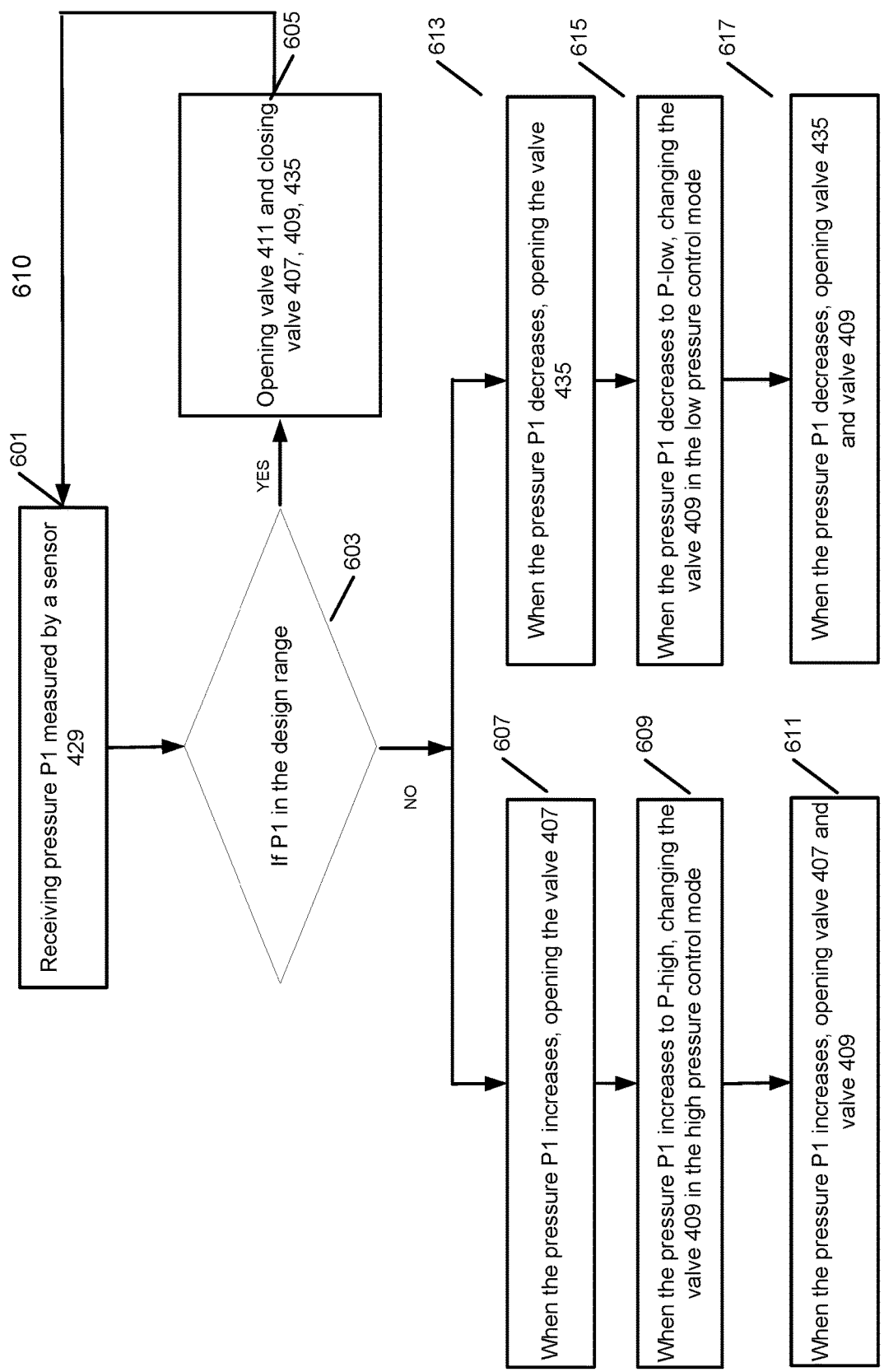
FIG. 6 is another flow diagram of an example process for a cooling system according to an embodiment of the application

FIG. 6 is a flow diagram of an example process 610 for a cooling system according to an embodiment of the application. For example, FIG. 6 shows the operation and control for the system shown in FIG. 5 using the pressure sensor and the two way valves for the first fluid.

At operation 601, the cooling system receives pressure P1 measured from the sensor 429. In an embodiment, at operation 603, when the P1 429 is in the design range, then moves to operation 605. At operation 605, the cooling system opens the valve 411, closes the valves 407, 409 and 435, and then moves back to operation 601.

In an embodiment, at operation 603, when the P1 is not in the design range, then moves to operations 607 or 613. For example, at operation 607, when the P1 is not in the design range and the received pressure P1 429 increases, the cooling system opens valve 407. At operation 609, when the pressure P1 429 increases and reaches to the P-high, the cooling system changes the valve 409 into the high pressure control mode. At operation 611, when the pressure P1 429 increases, the cooling system opens valve 407 and 409.

Similar as above, for example, at operation 613, when the P1 is not in the design range and the received pressure P1 429 decreases, the cooling system opens valve 435. At operation 615, when the pressure P1 429 decreases and reaches to the P-law, the cooling system changes the valve 409 into the low pressure control mode. At operation 617, when the pressure P1 429 decreases, the cooling system opens valve 435 and valve 409.

Figure 7A:
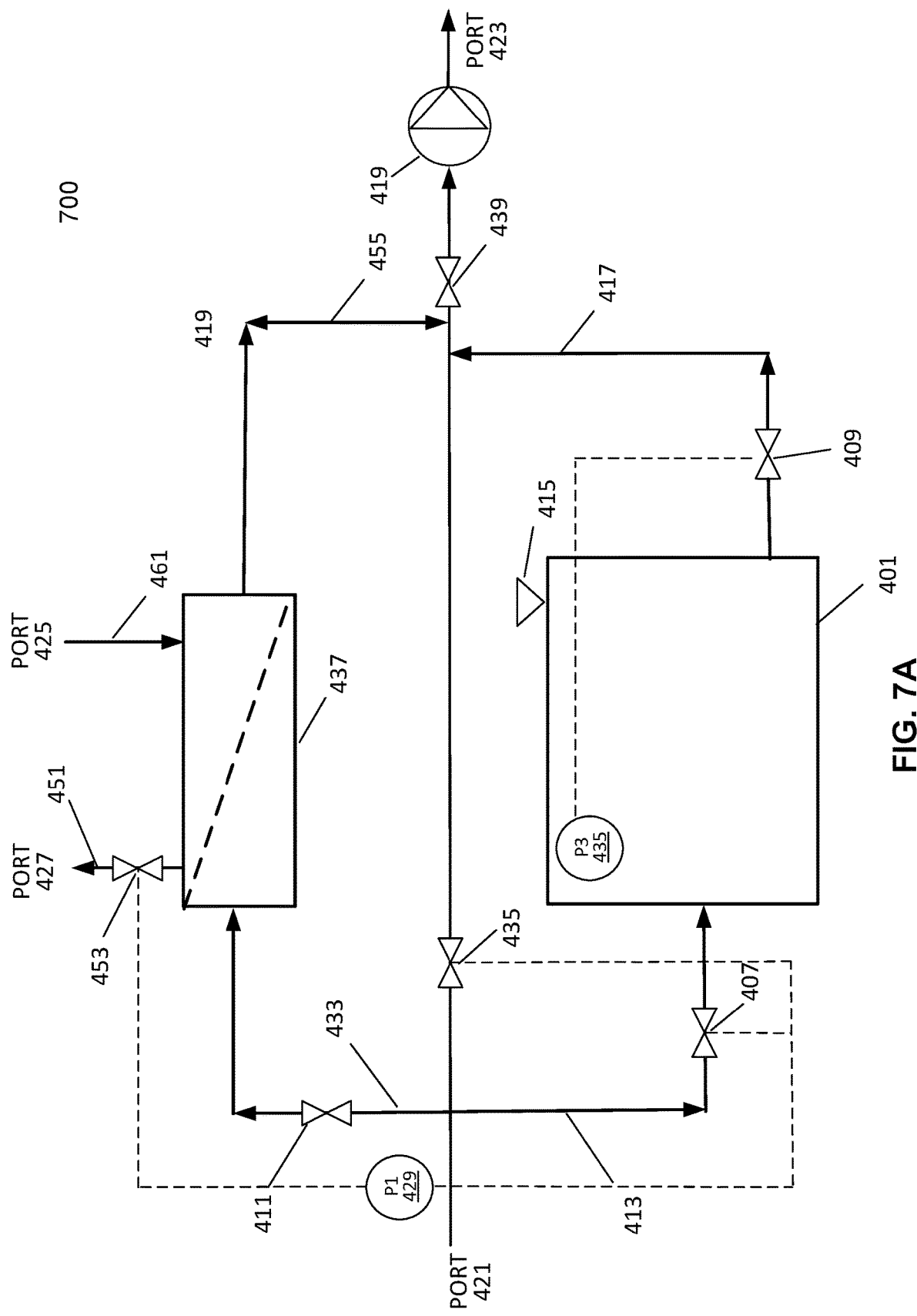
FIG. 7A shows another example cooling system according to an embodiment of the application.
Figure 7B:
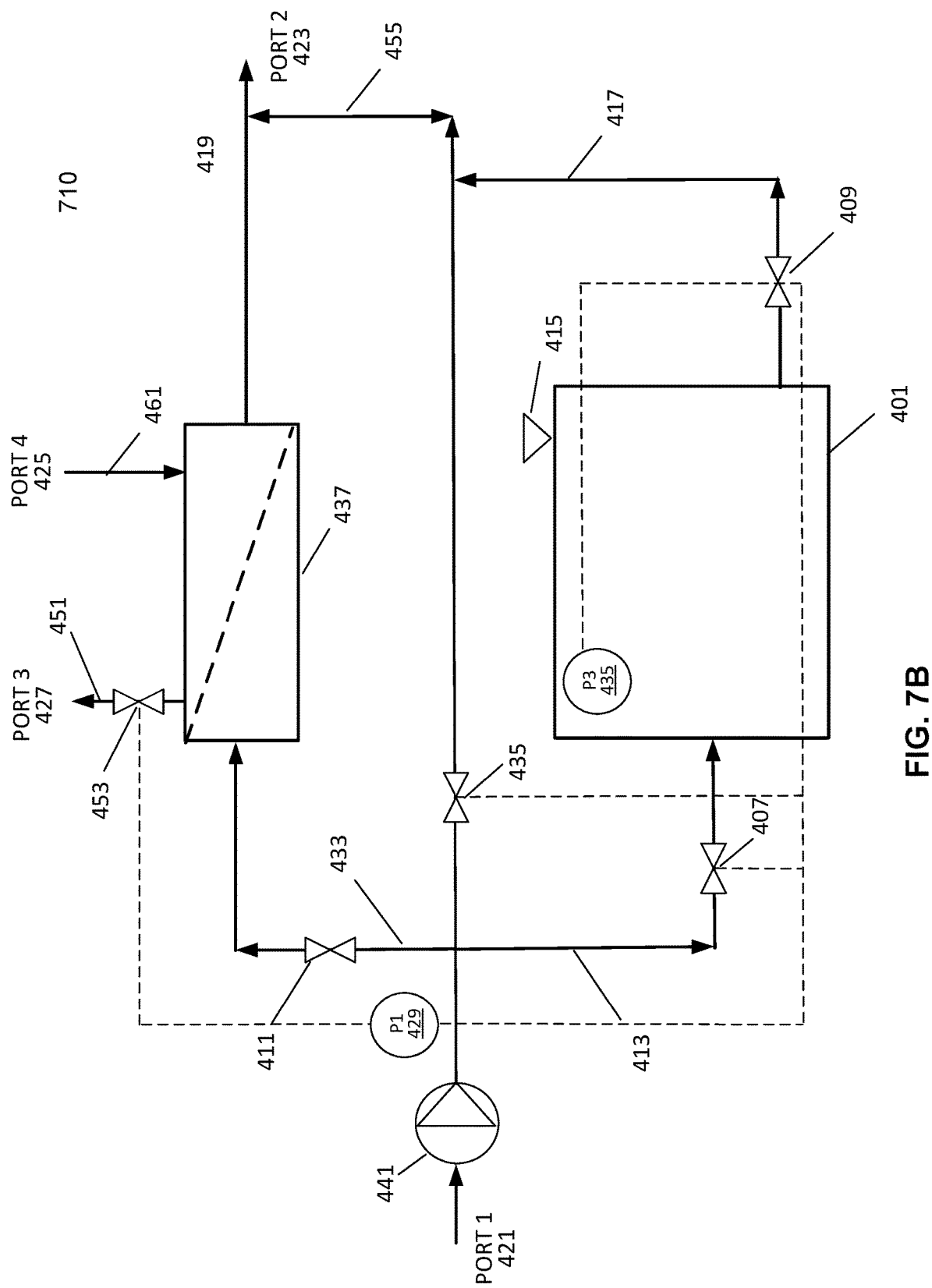
FIG. 7B shows another example cooling system according to an embodiment of the application.

FIGS. 7A and 7B show other example cooling systems (700, 710) according to embodiments of the application. For example, FIGS. 7A and 7B show full system regulating design using P1. In an embodiment, FIG. 7A shows that the pump 419 is used on the exit loop functioning as a pulling pump for the cooling system 700. In an embodiment, FIG. 7B shows that the design that pump 441 is designed as a pushing pump for the cooling system 710, and it may be treated as a pushing pump for the heat exchanger or the cooling system. For example, in the full system pressure regulating and controlling design, P1 421 is also used for controlling valve 453. In an embodiment valve 453 can be either a pressure controlled valve or a pressure triggered valve. For example, during variation of P1 421, when valve 435 and valve 407 are not triggered, an increasing of P1 421 represents an increasing of a flowrate to the main/heat exchanger loop 433.

In an embodiment, this requires an increasing on the external fluid 451 flowrate. For example, in this design, the pump (419, 441) maybe controlled by the fluid temperature in the loop. In an embodiment, the system fluid pressure measured by 429 is used for controlling several valves and fluid components, and this may require additional controller for tuning the input value of the P1 429 and then provide different actual control signals for different valves to function differently. Therefore, in an embodiment, P1 429 can be used as the original input, and each of the actual control output is calculated or processed based on the operation scenarios, system design and characteristics and so on.

Figure 7C:
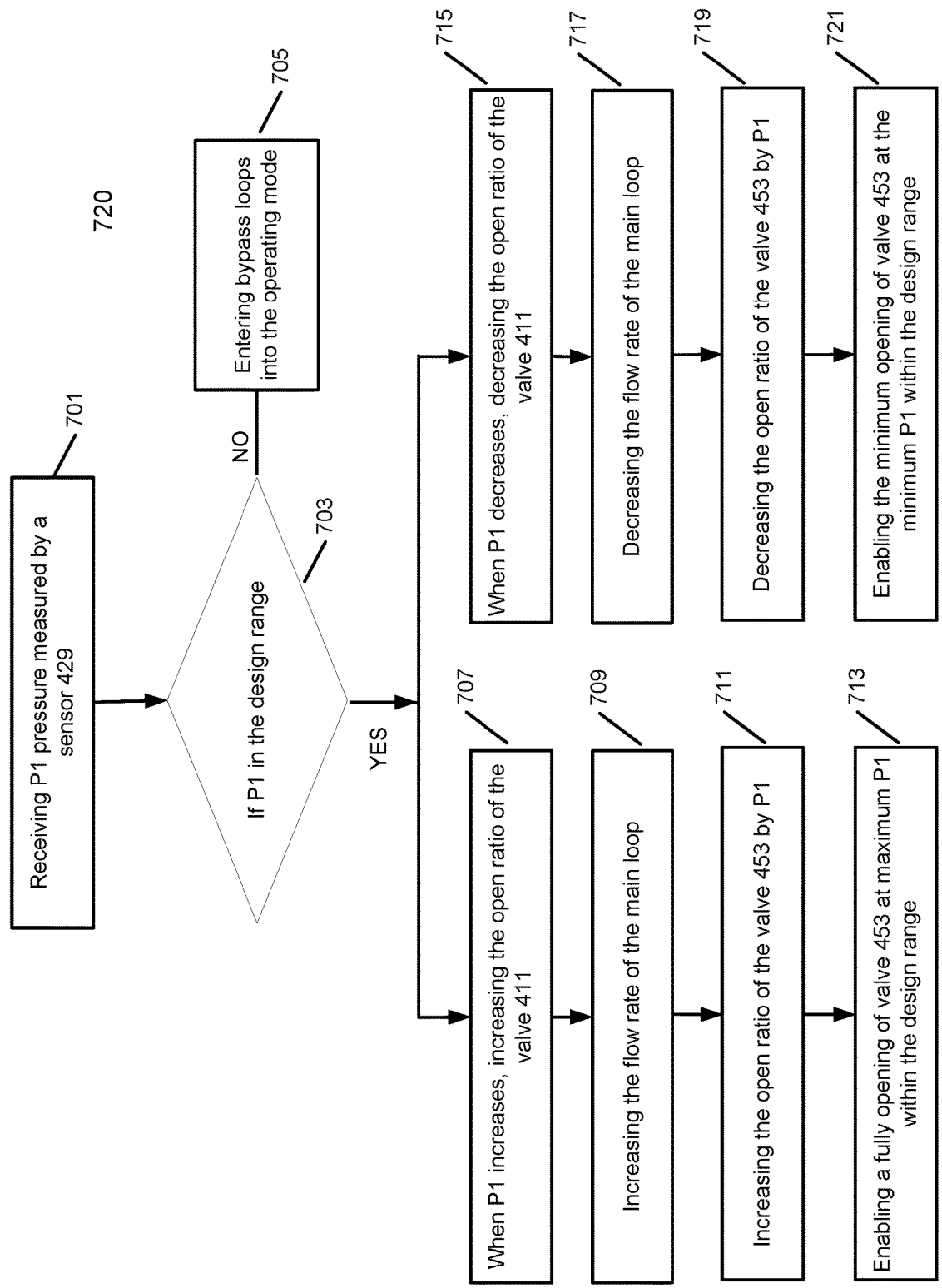
FIG. 7C is another flow diagram of an example process for a cooling system according to an embodiment of the application

FIG. 7C is a flow diagram of an example process 720 for a cooling system according to an embodiment of the application. For example, FIG. 7C shows the operation and control for the system shown in FIGS. 7A and 7B using the pressure sensor and two way valves for both the main fluid 433 and the heat exchanger fluid 451.

At operation 701, the cooling system receives pressure P1 measured from the sensor 429. In an embodiment, at operation 703, when the P1 429 is not in the design range, then moves to operation 705. At operation 705, the cooling system enters the bypass loop operating mode. It needs to be mentioned that even the operations of 707-713 and 715-721 are two separate branches, they may be connected in an actual sequence. For example, when system is at operation 713, it may continue to measure the P1 429, and then goes to process operation 715.

In an embodiment, at operation 703, when the P1 429 is in the design range, then moves to operations 707 or 715. For example, at operation 707, when the received pressure P1 429 increases, the cooling system increases the open ratio of the valve 411. At operation 709, the cooling system increases the flowrate of the main loop 433. At operation 711, the cooling system increases the open ratio of the valve 453 based on the pressure P1 429. At operation 713, the cooling system enables a fully opening valve 453 at the maximum pressure P1 429 within the design range.

For example, at operation 715, when the received pressure P1 429 decreases, the cooling system decreases the open ratio of the valve 411. At operation 717, the cooling system decreases the flowrate of the main loop 433. At operation 719, the cooling system decreases the open ratio of the valve 453 based on the pressure P1 429. At operation 721, the cooling system enables the minimum opening valve 453 at the maximum pressure P1 429 within the design range. It should be noted that the two loop control shown in the above two examples may require additional calculation and system tuning using the pressure data input from P1 429.

FIG. 8A shows another example cooling system 800 according to an embodiment of the application. For example, FIG. 8A shows an expansion system used on the buffer loop 413. In an embodiment, the expansion system has same valves in its inlet and outlet. In an embodiment, P5 449 and P4 447 can be understood as the control signal and the corresponding opening pressure for valve 407 and valve 409, respectively. For example, the P4 447 is controlled and connected with the air side 403 system in the expansion tank. In an embodiment, the air pressure adjustment functions are integrated on the expansion system for air side system pressure pre-charging and presetting, as well as for dynamic adjustment. In an embodiment, the pressure P3 435 of the air section 403 can be adjusted by air pressure adjustment valve 415. It needs to be mentioned that for two-phase system, the loops (413, 417) and corresponding port locations (457, 459) may follow certain requirement. For example, the port location 457 of the vapor loop 413 needs to be higher than the port location 459 the liquid loop 417.

Figure 8B:
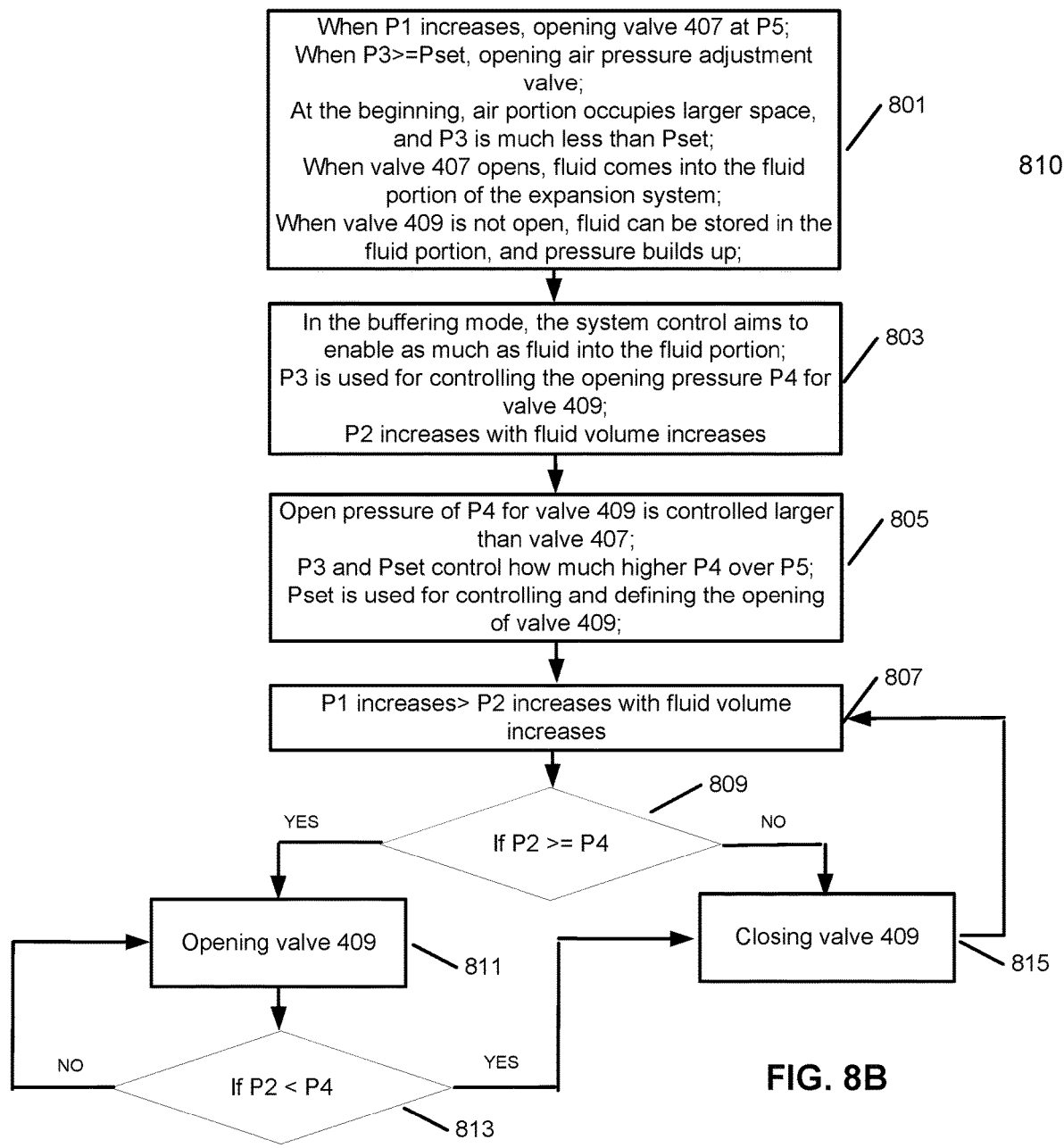
FIG. 8B is another flow diagram of an example process for a cooling system according to an embodiment of the application.

FIG. 8B is a flow diagram of an example process 810 for a cooling system according to an embodiment of the application. For example, FIG. 8B shows the operation and control for the system with expansion unit on the buffer loop shown in FIG. 8A using the two way valves. For example, the pressure P1 429 represents supply side pressure, the pressure P2 443 represents the pressure of the fluid portion 405 in the expansion system 401, the pressure P3 435 represents the pressure of the air portion 403 in the expansion system 401, the pressure P-set 445 represents the air charging pressure, the pressure P4 447 represents the controlled pressure of valve 409, and the pressure P5 449 represents the controlled pressure of valve 407.

At operation 801, when pressure P1 429 increases, the cooling system opens valve 407 based on P5 449; when pressure P3 435 greater or equal to P-set 445, opens air pressure adjustment valve 415; when valve 407 opens, the fluid comes into the fluid portion 405 of the expansion system 401; when valve 409 is not open, the fluid can be stored in the fluid portion 405, and the pressure builds up.

At operation 803, in the buffering mode, the system control aims to enable as much as fluid into the fluid portion 405; P3 435 is used for controlling the opening pressure P4 447 for valve 409; and P2 443 increases with fluid volume increases.

At operation 805, the open pressure of P4 447 for valve 409 is controlled larger than valve 407; the pressure P3 435 and P-set 445 control how much higher P4 447 over P5 449; and P-set 445 is used for controlling and defining the opening of valve 409.

At operation 807, the pressure P1 429 increases more than P2 443 increases with fluid volume increases 405.

At operation 809, if the pressure P2 443 is greater or equal to P4 447, then moves to operation 811. At operation 911, the cooling system opens valve 409. At operation 813, if the pressure P2 443 is not less than P4 447, then moves back to operation 811 to open the valve 409. At operation 813, if the pressure P2 443 is less than P4 447, then moves to operation 815 to close valve 409, and then moves back to operation 807.

At operation 809, if the pressure P2 443 is not greater or equal to P4 447, then moves to operation 815 to close valve 409 and then moves back to operation 807.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device, comprising:
   an inlet port and an outlet port to be coupled to one or more electronic devices through a plurality of loops including a first loop and a second loop;
   the first loop having a heat exchanger coupled to the inlet port and the outlet port, wherein the heat exchanger is to receive fluid from the inlet port, to extract heat generated by the electronic devices and carried by the fluid, and to return the fluid to the electronic devices via the outlet;
   the second loop coupled to the inlet port and the outlet port, the second loop configured in parallel with the first loop, wherein the second loop includes a buffer unit to temporarily buffer at least a portion of the fluid, wherein the buffer unit buffers variations in pressure and fluid volume;
   a first pressure controllable valve coupled to the first loop and the second loop, wherein the first pressure controllable valve is to selectively distribute at least a portion of the fluid to at least one of the first loop or the second loop based on a fluid pressure of the fluid; and
   an external loop coupled with the heat exchanger, an external pressure controllable valve and an external outlet port, wherein the heat exchanger is to receive external fluid from the external inlet port and to return the external fluid via the external outlet port.

2. The cooling device of claim 1, further comprising a third loop coupled between the first pressure controllable valve and the outlet port to operate as a direct bypass loop from the inlet port to the outlet port, bypassing the heat exchanger and the buffer unit.

3. The cooling device of claim 2, wherein the first pressure controllable valve is a four-way valve to selective to distribute the fluid received from the inlet port to at least one of the first loop, the second loop, or the third loop.

4. The cooling device of claim 2, wherein the first pressure controllable valve comprises:

a first valve coupled between the inlet port and an inlet of the heat exchanger to control a first fluid flowrate of fluid flowing into the heat exchanger based on the fluid pressure;
   a second valve coupled between the inlet port and an inlet of the buffer unit to control a second fluid flowrate of fluid flowing into the buffer unit; and
   a third valve coupled between the inlet port and the direct bypass loop to control a third fluid flowrate of fluid flowing through the direct bypass loop based on the fluid pressure.

5. The cooling device of claim 4, wherein the first valve is triggered to open in response to the fluid pressure being above a first pressure threshold, wherein the second valve is triggered to open in response to the fluid pressure being above a second pressure threshold, and wherein the third valve is triggered to open in response to the fluid pressure being above a third pressure threshold.

6. The cooling device of claim 5, wherein the first pressure threshold, the second pressure threshold, and the third pressure threshold are different.

7. The cooling device of claim 4, wherein the second loop further comprises a second pressure controllable valve disposed between an outlet of the buffer unit and the outlet port to control a flowrate of fluid from the outlet of the buffer unit to the outlet port.

8. The cooling device of claim 7, wherein the second pressure controllable valve is controlled based on a fluid pressure obtained from a pressure sensor within the buffer unit or a fluid pressure obtained from a pressure sensor disposed near the inlet port.

9. The cooling device of claim 7, wherein the third loop further comprises a fourth valve coupled between the third valve and the outlet port.

10. The cooling device of claim 9, wherein the second pressure controllable valve is coupled between the buffer unit and a connecting point between the third valve and the fourth valve.

11. The cooling device of claim 10, further comprising a fluid pump couple between an outlet of the heat exchanger and the outlet port to pump the fluid towards the outlet port.

12. The cooling device of claim 11, further comprising a bidirectional path coupled between the connecting point and an inlet of the fluid pump.

13. An electronic rack of a data center, comprising:
    one or more electronic devices operating as one or more servers; and
    a cooling system coupled to the one or more electronic devices, the cooling system including
       an inlet port and an outlet port to be coupled to the one or more electronic devices through a plurality of or more loops including a first loop and a second loop;
       the first loop having a heat exchanger coupled to the inlet port and the outlet port, wherein the heat exchanger is to receive fluid from the inlet port, to extract heat generated by the electronic devices and carried by the fluid, and to return the fluid to the electronic devices via the outlet;
       the second loop coupled to the inlet port and the outlet port, the second loop configured in parallel with the first loop, wherein the second loop includes a buffer unit to temporarily buffer at least a portion of the fluid, wherein the buffer unit buffers variations in pressure and fluid volume;
       a first pressure controllable valve coupled to the first loop and the second loop, wherein the first pressure controllable valve is to selectively distribute at least a portion of the fluid to at least one of the first loop or the second loop based on a fluid pressure of the fluid; and an external loop coupled with the heat exchanger, an external pressure controllable valve and an external outlet port, wherein the heat exchanger is to receive external fluid from the external inlet port and to return the external fluid via the external outlet port.

14. The electronic rack of claim 13, further comprising a third loop coupled between the first pressure controllable valve and the outlet port to operate as a direct bypass loop from the inlet port to the outlet port, bypassing the heat exchanger and the buffer unit.

15. The electronic rack of claim 14, wherein the first pressure controllable valve is a four-way valve to selective to distribute the fluid received from the inlet port to at least one of the first loop, the second loop, or the third loop.

16. The electronic rack of claim 14, wherein the first pressure controllable valve comprises:

a first valve coupled between the inlet port and an inlet of the heat exchanger to control a first fluid flowrate of fluid flowing into the heat exchanger based on the fluid pressure;

a second valve coupled between the inlet port and an inlet of the buffer unit to control a second fluid flowrate of fluid flowing into the buffer unit; and a third valve coupled between the inlet port and the direct bypass loop to control a third fluid flowrate of fluid flowing through the direct bypass loop based on the fluid pressure.

17. The electronic rack of claim 16, wherein the first valve is triggered to open in response to the fluid pressure being above a first pressure threshold, wherein the second valve is triggered to open in response to the fluid pressure being above a second pressure threshold, and wherein the third valve is triggered to open in response to the fluid pressure being above a third pressure threshold.

18. The electronic rack of claim 17, wherein the first pressure threshold, the second pressure threshold, and the third pressure threshold are different.

19. A data center system, comprising:

a plurality of electronic racks, each electronic rack including one or more servers; and a cooling system coupled to the electronic racks to provide liquid cooling to the servers, the cooling system including an inlet port and an outlet port to be coupled to one or more electronic devices through a plurality of or more loops including a first loop and a second loop;

the first loop having a heat exchanger coupled to the inlet port and the outlet port, wherein the heat exchanger is to receive fluid from the inlet port, to extract heat generated by the electronic devices and carried by the fluid, and to return the fluid to the electronic devices via the outlet;

the second loop coupled to the inlet port and the outlet port, the second loop configured in parallel with the first loop, wherein the second loop includes a buffer unit to temporarily buffer at least a portion of the fluid, wherein the buffer unit buffers variations in pressure and fluid volume;

a first pressure controllable valve coupled to the first loop and the second loop, wherein the first pressure controllable valve is to selectively distribute at least a portion of the fluid to at least one of the first loop or the second loop based on a fluid pressure of the fluid; and an external loop coupled with the heat exchanger, an external pressure controllable valve and an external outlet port, wherein the heat exchanger is to receive external fluid from the external inlet port and to return the external fluid via the external outlet port.

20. The data center system of claim 19, further comprising a third loop coupled between the first pressure controllable valve and the outlet port to operate as a direct bypass loop from the inlet port to the outlet port, bypassing the heat exchanger and the buffer unit.

* * * * *